(12) United States Patent
Garani

(10) Patent No.: US 8,397,125 B2
(45) Date of Patent: Mar. 12, 2013

(54) ENCODING APPARATUS, SYSTEM, AND METHOD USING LOW DENSITY PARITY CHECK (LDPC) CODES

(75) Inventor: Shayan Srinivasa Garani, San Diego, CA (US)

(73) Assignee: STMicroelectronics, Inc., Coppell, TX (US)

( * ) Notice: Subject to any disclaimer, the term of this patent is extended or adjusted under 35 U.S.C. 154(b) by 607 days.

(21) Appl. No.: 12/587,163

(22) Filed: Oct. 2, 2009

(65) Prior Publication Data

US 2010/0169736 A1 Jul. 1, 2010

Related U.S. Application Data

(60) Provisional application No. 61/204,093, filed on Dec. 31, 2008.

(51) Int. Cl.
*H03M 13/00* (2006.01)
*G06F 11/00* (2006.01)

(52) U.S. Cl. ........................................ 714/758; 714/801

(58) Field of Classification Search .................. 714/758, 714/801

See application file for complete search history.

(56) References Cited

U.S. PATENT DOCUMENTS

| | | | | |
|---|---|---|---|---|
| 6,633,856 B2* | 10/2003 | Richardson et al. | ............ | 706/15 |
| 6,961,888 B2* | 11/2005 | Jin et al. | ........................ | 714/752 |
| 7,774,689 B2* | 8/2010 | Chiu et al. | ..................... | 714/786 |
| 8,020,063 B2* | 9/2011 | Olaker et al. | .................. | 714/755 |
| 8,086,930 B2* | 12/2011 | Lee et al. | ........................ | 714/752 |
| 2008/0282127 A1* | 11/2008 | Mantha et al. | ................. | 714/751 |
| 2009/0019333 A1* | 1/2009 | McEvoy et al. | ................ | 714/752 |
| 2009/0049363 A1* | 2/2009 | Hocevar | ......................... | 714/758 |
| 2009/0100311 A1* | 4/2009 | Song et al. | ..................... | 714/752 |

OTHER PUBLICATIONS

Divsalar, D.; Jones, C.; Dolinar, S.; Thorpe, J.; , "Protograph based LDPC codes with minimum distance linearly growing with block size," Global Telecommunications Conference, 2005. GLOBECOM'05. IEEE , vol. 3, No., pp. 5 pp., Nov. 28-Dec. 2, 2005.*

Andrews, K.; Dolinar, S.; Thorpe, J.; , "Encoders for block-circulant LDPC codes," Information Theory, 2005. ISIT 2005. Proceedings. International Symposium on , vol., No., pp. 2300-2304, Sep. 4-9, 2005.*

J Thorpe "Low-Density Parity-Check (LDPC) Codes Constructed from Protographs" IPN Progress Report 42-154 Aug. 15, 2003 http://www.ldpc-codes.com/papers/154C.pdf.*

* cited by examiner

*Primary Examiner* — Cynthia Britt

(57) ABSTRACT

A system and method is capable of performing a Low Density Parity Check (LDPC) coding operation on-the-fly without using a generator matrix. The system and method includes an input configured to receive data and an output configured to output a plurality of codewords. The system and method also includes a processor coupled between the input and the output. The processor is configured to encode the received data and produce the plurality of codewords using a plurality of parity bits. The processor creates the plurality of parity bits on-the-fly using a portion of an LDPC matrix and a protograph matrix.

20 Claims, 3 Drawing Sheets

ENCODING APPARATUS, SYSTEM, AND METHOD USING LOW DENSITY PARITY CHECK (LDPC) CODES

CROSS-REFERENCE TO RELATED APPLICATION(S) AND CLAIM OF PRIORITY

The present application is related to U.S. Provisional Patent No. 61/204,093, filed Dec. 31, 2008, entitled "ENCODING APPARATUS, SYSTEM, AND METHOD USING LOW DENSITY PARITY CHECK (LDPC) CODES". Provisional Patent No. 61/204,093 is assigned to the assignee of the present application and is hereby incorporated by reference into the present application as if fully set forth herein. The present application hereby claims priority under 35 U.S.C. §119(e) to U.S. Provisional Patent No. 61/204,093.

TECHNICAL FIELD OF THE INVENTION

The present application relates generally to encoding systems and, more specifically, to a system and method for encoding operations using low density parity check (LDPC) codes.

BACKGROUND OF THE INVENTION

A Low-Density Parity-Check (LDPC) code is an error correcting code is used when transmitting a message over a noisy transmission channel. The use of LDPC codes often provides superior error correction capabilities. The use of LDPC codes also often supports communications that approach their theoretical maximum transmission rates (known as Shannon capacity limits). However, conventional LDPC techniques are often not hardware friendly, involve complex operations, and require the use of substantial memory and circuitry (and are therefore difficult to realize in small circuits such as a system-on-a-chip).

SUMMARY OF THE INVENTION

A device capable of encoding data using a Low Density Parity Check (LDPC) code is provided. The device includes an input configured to receive data and an output configured to output a plurality of codewords. The device also includes a processor coupled between the input and the output. The processor is configured to encode the received data and produce the plurality of codewords using a plurality of parity bits. The processor is configured to create the plurality of parity bits on-the-fly.

A system for transmitting data is provided. The system includes at least one encoder. The encoder includes a processor array. The processor array is configured to: generate a plurality of parity bits based on a portion of the Low Density Parity Check (LDPC) H Matrix and at least one protograph matrix. The processor array also is configured to perform an LDPC coding operation using the plurality of parity bits.

A method for coding data is provided. The method includes generating, by at least one encoder unit, a plurality of parity bits based on a portion of the Low Density Parity Check (LDPC) H Matrix and at least one protograph matrix. The method also includes performing an LDPC coding operation using the plurality of parity bits.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

Practical advancements in developing area and power efficient hardware for decoding LDPC codes have paved the way for realizing an LDPC based system in magnetic storage and other applications. Though random LDPC codes are an excellent choice to meet the channel performance, the LDPC codes are not viable due to high memory and computational requirements, often resulting in large silicon area and power.

LDPC codes are linear codes that can be characterized by sparse parity check matrices H. The H-matrix has a low density of one's (1's). The sparseness of H yields a large $d_{min}$ and reduces decoding complexity. An exemplary H-matrix is represented by Equation 1:

$$H = \begin{bmatrix} 1 & 1 & 1 & 0 & 1 & 0 \\ 1 & 0 & 1 & 1 & 0 & 1 \\ 0 & 0 & 1 & 0 & 1 & 0 \end{bmatrix}. \quad [\text{Eqn. 1}]$$

Two families of LDPC codes exist: a regular LDPC code and an irregular LDPC code. An LDPC code is regular if: every row has the same weight, $W_r$; and every column has the same weight, $W_c$. The regular LDPC code is denoted by $(W_c, W_r)$-regular. Otherwise, the LDPC code is irregular. Regular codes are easier to implement and analyze. Further, regular codes have lower error floors. However, irregular codes can get closer to capacity than regular codes and, as such, can provide higher coding gain.

Figure 1:
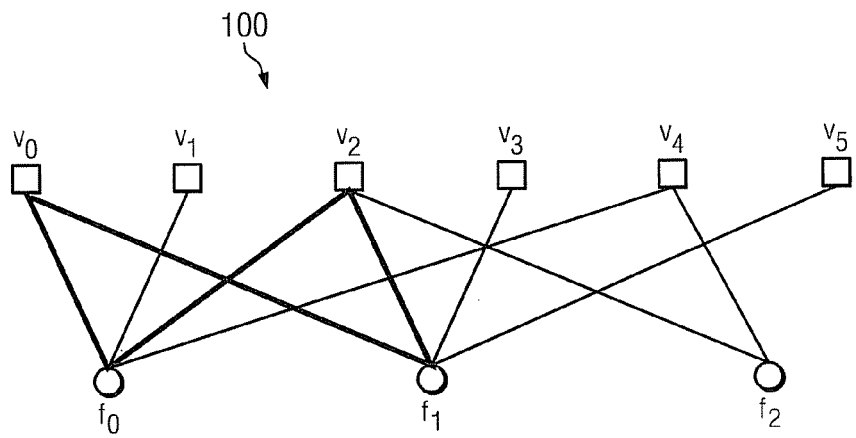
FIG. 1 illustrates a Tanner graph corresponding to a parity check matrix according to embodiments of the present disclosure.

FIG. 1 illustrates a Tanner graph corresponding to a parity check matrix according to embodiments of the present disclosure. The embodiment of the Tanner graph 100 shown in FIG. 1 is for illustration only. Other embodiments of the Tanner graph 100 could be used without departing from the scope of this disclosure.

The Tanner graph 100 is a bipartite graph. In bipartite graphs, nodes are separated into two distinctive sets and edges are only connecting nodes of two different types. The two types of nodes in the Tanner graph 100 are referred to as Variable Nodes (hereinafter "v-nodes") and Check Nodes (hereinafter "c-nodes")

V-nodes correspond to bits of the codeword or, equivalently, to columns of the parity check H-matrix. There are n v-nodes. V-nodes are also referenced as "bit nodes". C-nodes correspond to parity check equations or, equivalently, to rows of the parity check H-matrix. There are at least m=n−k c-nodes.

The Tanner graph 100 corresponds to the parity check H-matrix illustrated by Equation 1. The Tanner graph 200 includes three (3) c-nodes (also referred to as factor nodes, the number of parity bits) and six (6) v-nodes (the number of bits in a codeword). C-node $f_i$ is connected to v-node $v_j$ if the element $h_{ij}$ of H-matrix is a one (1). For example, v-node $v_0$ is connected $f_0$ and $f_1$. The connection between $v_0$ and $f_0$ corresponds to $h_{00}$; the connection between $v_1$ and $f_0$ corresponds to $h_{01}$; and so forth. Therefore, the connections to $f_0$ correspond to the first row in the H-matrix, further illustrated in Equation 2:

$$\overline{H}_0 = [1\ 1\ 1\ 0\ 1\ 0]. \quad [\text{Eqn. 2}]$$

A degree of a node is the number of edges (e.g., connections) connected to the node. A cycle is a total length, in the Tanner graph 100, of a path of distinct edges that closes upon itself. A path from $v_0 \rightarrow f_0 \rightarrow v_2 \rightarrow f_1 \rightarrow v_0$ is an example of a short cycle. Short cycles should be avoided since short cycles adversely affect decoding performance. Short cycles manifest themselves in the H-matrix by columns with an overlap two (2).

As such, in the H matrix in Equation 1, each row represents one of the three parity-check constraints, whereas each column represents one of the six bits in the received codeword. In this example, the eight (8) codewords can be obtained by putting the parity-check matrix H into this form through basic row operations.

From this, a generator matrix G can be obtained. The generator matrix is a basis for a linear code in conventional LDPC encoders, generating all its possible codewords. The generator matrix can be multiplied with the data to form the codewords. If the matrix is "G" and the data is "c", then a codeword (" $C_w$ ") can be defined by Equation 3:

$$C_w = cG. \quad [\text{Eqn. 3}]$$

In Equation 3, $C_w$ is a unique codeword of the information/data bit c, c is a unique row vector, and a bijection exists between $C_w$ and c. A generator matrix for a (n, M=qk, d) q-code is of dimension k×n. Here n is the length of a codeword, k is the number of information bits, d is the minimum distance of the code, and q is the number of symbols in the alphabet (thus, q=2 indicates a binary code, and so forth).

The systematic form for a generator matrix is defined by Equation 4:

$$G = [I_k | P] \quad [\text{Eqn. 4}]$$

In Equation 4, $I_k$ is a k×k identity matrix and P is of dimension k×r. The generator matrix is a dual space of a parity check matrix. The generator matrix can be used to construct the parity check matrix for a code (and vice-versa). The generator matrix G is stored in a memory of the conventional LDPC encoder. Further, the generator matrix G can be quite large, often occupying large amounts of the memory, especially for high-code rates.

Embodiments of the present disclosure provide a system and method for systematically encoding LDPC encoders based on a parity prototype structure. The parity prototype structure can be used to generate codewords without constructing the generator matrix. These embodiments further provide encoding processes adapted to work well with a broad geometry of matrices, including array codes. The processes for obtaining LDPC matrix structures (parity check matrices) with a fixed protograph in the parity portion to facilitate encoding are disclosed. Rank properties in the matrix construction and the conditions for building such matrices also are disclosed. Further, the construction of an efficient encoder based on a set of matrix protographs is described, and extensions to the process to work with finite field codes are disclosed.

Figure 2:
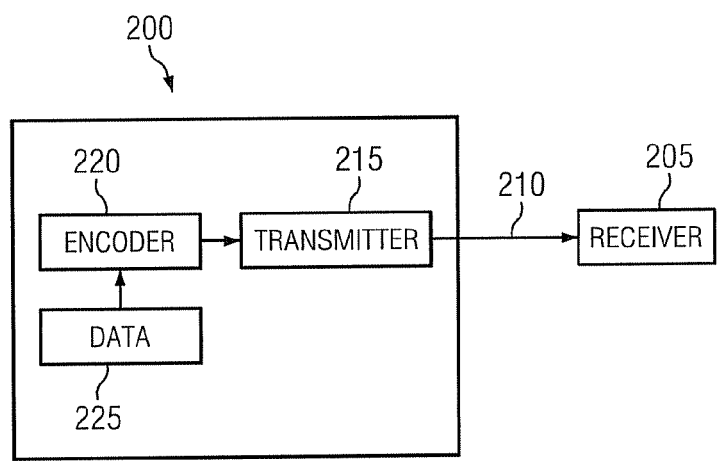
FIG. 2 illustrates a system capable of transmitting encoding data in according to embodiments of the present disclosure.

FIG. 2 illustrates a system capable of transmitting encoded data in according to embodiments of the present disclosure. The embodiment of the transmission system shown in FIG. 2 is for illustration only. Other embodiments could be used without departing from the scope of this disclosure.

The transmission system includes a transmission device 200 in communication with a receiving device 205. The transmission device 200 and the receiving device 205 can be included in a single system, such as within a computer system. For example, the transmission device 200 can represent a first component within a computer that reads data, such as, for example, from a magnetic storage medium, optical storage, or a multimedia storage means, and sends it to a second component and the receiver can represent the second component that receives the data. In some embodiments, the transmission device 200 and the receiving device 205 are included in separate systems disposed at different locations. The transmission device 200 can transmit data to the receiving device 205 via a channel 210. The channel 210 can be a configured to carry data over short distances or the channel 210 can be configured to carry data over long distances. In some embodiments, the channel 210 is a wire-line link. In some embodiments, the channel 210 is wireless link, such as, for example, a Wireless Fidelity (WiFi) connection, a Worldwide Interoperability for Microwave Access (WiMAX), a cellular connection, an infrared connection, and a Bluetooth® connection.

In some embodiments, the transmission device 200 includes a transmitter 215. The transmitter 215 can be a single unit configured to transmit data. Additionally and alternatively, the transmitter 215 can be a transceiver that includes a transmitter and a receiver (transceiver not specifically illustrated). The transmitter 215 can be configured to transmit data via the channel 210. For example, when the channel 210 is a wireless link, the transmitter 215 can include one or more antennas that can transmit the data wirelessly to the receiving device. Additionally, the receiving device 205 can include a receiver (not specifically illustrated) that includes one or more antennas that can receive the data via the channel 210.

The transmission device 200 includes an encoder 220. The encoder 220 is configured transform data 225 from a first format into a second format. The encoder 220 can encode the data 225 to improve or optimize the data 225 for transmission from the transmission device 200 to the receiving device 205. The encoder 220 can be configured to encode the data 225 using an LDPC code.

The data 225 can be provided to or read by the transmission device 100. The data 225 can be stored in a computer storage medium. The computer storage medium can be any computer readable medium, for example, the computer storage medium can be any electronic, magnetic, electromagnetic, optical, electro-optical, electro-mechanical, and/or other physical device that can contain, store, communicate, propagate, or transmit a computer program, software, firmware, or data for use by the microprocessor or other computer-related system or method.

Figure 3:
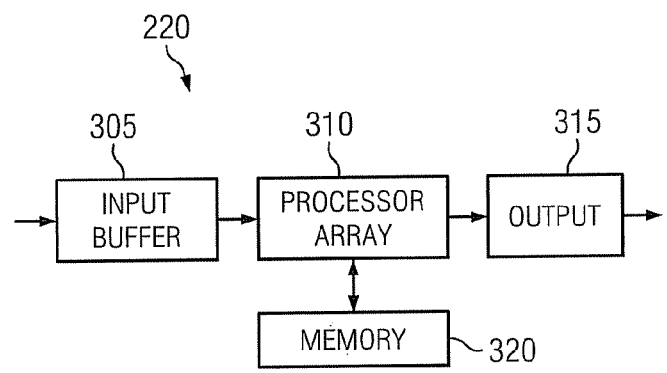
FIG. 3 illustrates an encoder according to embodiments of the present disclosure.

FIG. 3 illustrates an encoder according to embodiments of the present disclosure. The embodiment of the encoder 220 shown in FIG. 3 is for illustration only. Other embodiments could be used without departing from the scope of this disclosure.

The encoder 220 can include an input buffer 305. The input buffer block 305 is configured to receive data 225. The input buffer block 305 includes a number of memory blocks for storing the received data 225.

The encoder 220 includes a processor block 310. The processor block 310 can include one processor or a processor array that includes a plurality of processors. The processor array 310 is configured to read the H-matrix from an instruction encoder block (not specifically illustrated). In some embodiments, the instruction encoder is included in the processor block 310. In some embodiments the instruction encoder block is disposed external to the processor block 310. The processor block 310 is configured to read the data 225 from the input buffer 305. The processor block 310 uses the H-matrix to determine to where to write the data (e.g., codewords or symbols) in an output buffer 315. The processor block 310 is configured to perform a flooding technique, sum products technique or min-sum technique. For example, the processor block 310 can be configured to find minimum values using a min-sum technique. Further, the processor block 310 is configured to perform decoding for any one or more of a number of different communication mediums such as, for example, WiFi, WiMax, DVB-S2 and 4G.

The processor block 310 processes the data 225 using, at least in part, the H-matrix. The data 225 is transformed by the processor block 310 to form one or more codewords (or symbols). The codewords, or symbols, are output via output 315.

The processor block 310 also can write information to and read information from a memory block 320. The memory block 320 can be any computer readable medium, for example, the memory block 320 can be any electronic, magnetic, electromagnetic, optical, electro-optical, electro-mechanical, and/or other physical device that can contain, store, communicate, propagate, or transmit a computer program, software, firmware, or data for use by the microprocessor or other computer-related system or method. In some embodiments, the H-matrix can be saved in memory block 320. In some embodiments, the memory 320 includes a plurality of instructions configured to cause the processor block 310 to perform the LDPC functions.

The encoder 220 is configured to perform an LDPC encoding operation. The encoder 220 can programmable for handling several rates without additional penalty. Further, the encoder 220 can use an H-matrix based on array shifts. An array code-based parity check matrix $H:=[h_{ij}]$ has a tile of circulant matrices $h_{ij}$ such that the circulant shifts $a_{ij}$ chosen randomly over a special linear group of order p with the property illustrated in Equation 5:

$$a_{lp}-a_{mp} \neq a_{lq}-a_{mq} \mod(p). \qquad [\text{Eqn. 5}]$$

Equation 5 helps to ensure that the resulting Tanner group is devoid of four cycles. For example, since there may be a stringent requirement that the code is free of short cycles due to performance issues, the constraints imposed in Equation 5 are used initially.

Many regular parity check matrices can satisfy Equation 5. Starting from different random seeds for a random number generator to obtain the various shifts, it may be that most or all matrices satisfying Equation 5 have the same or similar performance, unless further constraints are imposed on the matrix design to reduce higher girth cycles. Various shifts can be interpreted as different local inter-leavers embedded within the parity check matrix. For example, Equation 6 illustrates how an exemplary 3×4 parity check matrix can be populated with array shifts satisfying Equation 5 from a group of order 133:

$$H := \begin{bmatrix} 45 & 117 & 14 & 28 \\ 75 & 12 & 111 & 121 \\ 23 & 107 & 129 & 124 \end{bmatrix}. \qquad [\text{Eqn. 6}]$$

The matrix structure based on array shifts is suitable for obtaining regular codes that can work with general quasi-cyclic encoders (provided some rank conditions are satisfied). Quasi-cyclic (QC) codes are a generalization of cyclic codes whereby a cyclic shift of a codeword by p positions results in another codeword. Therefore, cyclic codes are QC codes with p=1. The QC codes can be described by circulants. A variant of the above protograph shown in Equation 6 includes some controlled null matrices embedded within the array shifts. The insertion of null matrices can eliminate some short cycles and can make the matrix slightly irregular, leading to better performance. Additionally, a column weight can be reduced by one, leading to less parity bit protection on some variable nodes and degrading the performance. In embodiments where the benefits of null insertions on performance can outweigh the loss, such a design may be feasible or desirable. Furthermore, nulls can improve the throughput by some margin and can be a positive benefit.

For example, using the 3×4 parity check matrix above, the shift corresponding to the second row and column in the 3×4 parity check matrix can be punctured, leading to the protograph illustrated in Equation 7:

$$H := \begin{bmatrix} 45 & 117 & 14 & 28 \\ 75 & 0 & 111 & 121 \\ 23 & 107 & 129 & 124 \end{bmatrix}. \qquad [\text{Eqn. 7}]$$

Additional constraints can be imposed to eliminate 6-cycles in the graph, such as illustrated in Equation 8:

$$(a_{lp}-a_{lr})+(a_{mq}-a_{mp})+(a_{nr}-a_{nq}) \not\equiv 0 \bmod(p).\qquad[\text{Eqn 8}]$$

Moreover, there may be special trapping set structures in the graph that may be potentially harmful in the error floor region. Such structures can be detected in the matrix construction and improved further. Techniques for designing parity check matrices can include the following constraints: progressively eliminate six to eight (6/8) cycles that are connected to each other by two or more edges, and eliminate clusters of higher girth cycles. It may also be noted that imposing too many constraints may not result in a matrix that can satisfy all constraints, so properties of the matrix can be inductively controlled, and performance degradation can be examined to select proper constraints.

In some embodiments, these parity check matrix structures then can be used by an encoder. Alternatively, the encoder can be configured to use a Richardson and Urbanke encoding process.

The Richardson and Urbanke encoding process can be found in Richardson and Urbanke, "Efficient encoding of Low-Density Parity Check Codes," IEEE. Trans. Inform. Theory, vol. 47, no. 2, pp. 638-666, February 2001, the contents of which hereby are incorporated by reference in their entirety. When using the Richardson and Urbanke encoding process, a design of the encoder can include a process for matrix re-structuring, a process for singular value reduction, a process for parity equation solution, and a process for design choices and theoretical analysis.

During matrix restructuring, given a parity check matrix H, the columns are shuffled to obtain a matrix of the form illustrated in Equation 9:

$$H_1 = \begin{pmatrix} A & B & T \\ C & D & E \end{pmatrix}.\qquad[\text{Eqn. 9}]$$

If the dimensions of H are m×n, the dimensions of the component matrices can be as defined in Equations 10-15:

$$A: m-g \times n-m \qquad [\text{Eqn. 10}]$$

$$B: m-g \times g \qquad [\text{Eqn. 11}]$$

$$T: m-g \times m-g \qquad [\text{Eqn. 12}]$$

$$C: g \times n-m \qquad [\text{Eqn. 13}]$$

$$D: g \times g \qquad [\text{Eqn. 14}]$$

$$E: g \times m-g. \qquad [\text{Eqn. 15}]$$

Pre-multiplying Equation 9 by $$\begin{pmatrix} I & 0 \\ -ET^{-1} & I \end{pmatrix}$$

provides Equation 16:

$$H_2 = \begin{pmatrix} A & B & T \\ -ET^{-1}A+C & -ET^{-1}B+D & 0 \end{pmatrix}.\qquad[\text{Eqn. 16}]$$

If $H_2$ is full rank, the parity bits can be obtained as follows. Express the desired codeword as $\bar{x}=(\bar{s}\ \bar{p}_1\ \bar{p}_2)$ in systematic form, where $\bar{s}$ denotes information bits and $\bar{p}_1, \bar{p}_2$ denote parity bit vectors. Since $H_2\bar{x}^T=0$, the following set of matrix Equations 17 and 18 may solve for the parity bits:

$$\bar{p}_1^T=(-ET^{-1}B+D)^{-1}(-ET^{-1}A+C)\bar{s}^T.\qquad[\text{Eqn. 17}]$$

$$\bar{p}_2^T=-T^{-1}(A\bar{s}^T+B\bar{p}_1^T).\qquad[\text{Eqn. 18}]$$

From Equations 17 and 18, it can be seen that parity bits can be solved provided $-ET^{-1}B+D$ is non-singular. Note that if the matrix H is full rank, the matrix $H_1$ can be re-shuffled in such a way that the resulting matrix, after re-shuffling and transformation, always results in $-ET^{-1}B+D$ being non-singular.

During singular value reduction or decomposition, the general case for encoding is when the matrix H is not full rank. A rank deficit matrix implies that some of the rows are redundant. The following procedure transforms this type of matrix into a form that is suitable for encoding. First, check for the rank of the matrix and perform singular value decomposition on the parity check matrix such that the last few rows are nulled out. This corresponds to the rank deficiency of the original matrix. Second, shuffle and perform linear transformations as described above to produce a matrix in the form of Equation 16. The remainder of the encoding procedure is straightforward as outlined in Equations 17 and 18. However, one of the main drawbacks with the Richardson and Urbanke type encoder is the associated complexity when dealing with matrices that have some sort of regularity in their structure. Since the parity check matrix columns are permuted during the shuffling process, the original matrix structure is lost.

Additionally, in some embodiments, the encoder is configured as an alternative encoder for Quasi-Cyclic Codes. Though the Richardson and Urbanke type encoder is a very general type approach, it may not be the best solution keeping hardware constraints and the matrix structure in mind. For the class of array shifts, the encoder presented in Li et al., "Efficient encoding of quasi-cyclic low density parity check codes," IEEE. Trans. Comm., vol. 54, no. 1, pp. 71-81, 2006 (the contents of which hereby are incorporated by reference in their entirety) may work well with a broad class of codes (provided certain rank conditions are satisfied). However, when configured as an alternative encoder for Quasi-Cyclic Codes, the encoder still stores a generator matrix.

To overcome the deficiencies in the alternative encoder for Quasi-Cyclic Codes and the Richardson and Urbanke type encoder, in some embodiments the encoder 220 is configured as an "On The Fly" generic encoder. The encoder 220, configured as an On The Fly (OTF) generic encoder is configured to solve the parity bits on-the-fly using a set of linearly independent equations and supports a wide range of code rates and block lengths without any degradation in the system performance while meeting the high throughput requirements. The OTF structure is flexible and can incorporate both regular and irregular geometries in the systematic portion providing flexibility in terms of performance and design needs. In addition to these benefits, OTF encoding is applicable for large block length codes and to realize variable rate coding. The technique can be readily generalized for finite fields.

On-the-fly encoding comprises generating parity bits while processing (e.g., encoding) the received data. The parity bits are created on-the-fly by the encoder 220. Further, using the methods outlined herein, the encoder 220 can create the parity bits on-the-fly without using a generator matrix or requiring the generator matrix to be stored in memory.

The parity check matrix is split into the systematic part and the parity part. The systematic part is the portion presenting the information bits and the parity part is the portion that stores the parity bits.

Before providing a derivation of the LDPC encoder, details for the existence of the encoder are presented. First, a 4-cycle free parity check matrix can be constructed based on random quasi-cyclic shifts. The rank of this matrix can be 'r' where r≦min(m,n). Irrespective of the whether the parity check matrix is full rank or rank deficit, the matrix H is decomposed into two sub matrices as shown in Equation 19:

$$H := [A|B].$$ [Eqn. 19]

The matrix A can be chosen such that rank(A)=rank(H)=r. The columns of circulant blocks from H are shuffled to form a matrix $\tilde{H}$. Further, a bijective function over a set of integer indices is represented by $\psi := [1, 2, \ldots, n] \to [1, 2, \ldots, n]$.

Accordingly, two concepts can be established. The first concept is that there may always exist a shuffle $\psi$ such that the quasi-cyclic matrix $\tilde{H}$ can be decomposed as $\tilde{H} = (A|B)$ with rank(A)=rank($\tilde{H}$)=rank(H). For example, the first concept can be illustrated by shuffling column blocks, which does not alter short cycles (4 cycles), meaning girth($\tilde{H}$)=girth(H). By construction of the alternative quasi-cyclic coding process as disclosed in Li et al. (incorporated by reference herein above), the matrix H is devoid of short cycles. H can be denoted as $H = [\bar{h}_1 \bar{h}_2 \ldots \bar{h}_j]$, where $\bar{h}_m$ denotes a column of block circulant matrices. Consider the shuffle $\psi$ acting on H permuting the order in which the columns appear. Therefore, the transformed matrix $\tilde{H}$ after shuffle can be shown by Equation 20:

$$\tilde{H} = \psi(H) = [\bar{h}_{\psi(1)} \bar{h}_{\psi(2)} \ldots \bar{h}_{\psi(j)}].$$ [Eqn. 20]

Further, $h_{lp}$ can denote the block circulant matrix in the $l^{th}$ row layer and $p^{th}$ column layer with a circular shift of $a_{lp}$ units relative to the identity matrix. Then, the condition for a 4-cycle free Tanner graph is shown in Equation 21:

$$a_{lp} - a_{mp} \neq a_{lq} - a_{mq} \bmod(n),$$ [Eqn. 21]

where 'n' is the circulant order of the group. Since Equation 21 holds true for the matrix $\tilde{H}$:

$$a_{l,\psi(p)} - a_{m,\psi(p)} \neq a_{l,\psi(q)} - a_{m,\psi(q)} \bmod(n).$$ [Eqn. 22]

By construction of the alternative quasi-cyclic coding process and bijectivity of $\psi$, Equations 21 and 22 are identical. Therefore, since H is 4-cycle free, $\tilde{H}$ also is 4-cycle free.

The second concept is that replacing some of the circulant blocks by null matrices of the same size does not create any short cycles. In an additional example illustrating the second concept, a parity matrix is composed of a tile of non-zero block circulant matrices devoid of short cycles. For example, replacing a block circulant with a null matrix is equivalent to removing some edges from the original Tanner graph that is free of 4-cycles. An additional cycle can only be formed if and only if an extra edge is added to the original graph. Since edges are being deleted, at most, a same number of cycles and the same girth properties as present in the original graph can result.

Using these two concepts, an efficient encoding process for the family of quasi-cyclic codes can be obtained.

The Protograph structures for matrix equation solution can be determined as follows. First, let k and n denote the user and codeword lengths respectively. The LDPC matrix H of dimensions (n−k)×n can be decomposed as H:=[A|B], where the sub-matrices A and B are of dimensions (n−k)×(n−t) and (n−k)×t respectively. A family of code rates of the form illustrated in Equation 23 with t=n−k is sought.

$$R = 1 - \frac{t}{n}$$ [Eqn. 23]

A prototype structures for matrix B can be designed so that the parity bits can be solved on-the-fly in a block-by-block fashion. The matrix B is configured to include a full rank over the chosen Galois field (for example, gfrank(B)=t). A quasi-cyclic structure for matrix B is chosen by tiling permutation matrices of size s×s along with the insertion of a few null circulants to ensure full rank. As stated hereinabove, the insertion of a few null circulants does not in any significant way adversely affect the properties of the overall matrix. Insertion of null circulants will not lower already existing girth properties of the original structure. However too many null insertions may manifest as mis-corrections and high error floors. As such, a preferred embodiment includes an average column weight greater than '3.8' (column weight>3.8).

The prototypes can be derived according to the following conditions:

1) gfrank(H)=gfrank(B)=t=n−k;

2) girth(H)>4; and 3) t is an integral multiple of s.

Condition (1) helps to ensure the existence of an encoding structure that can be done on-the-fly. Condition (2) helps to ensure that the associated Tanner graph includes good girth properties to meet the performance requirements. Condition (3) facilitates the encoder structure.

For example, suppose B is a 4×4 block array of circulants. The prototypes can be denoted as $B_p$. A few examples of $B_p$ are enumerated below where t=4s and where the prototype matrices are full rank over GF(2). A '1' in the prototype indicates that a permutation matrix of size s is associated within that block. A '0' indicates that a null circulant is written in that block. It will be understood that the following set is not completely exhaustive but is provided merely as an example. Keeping the encoding structure in mind, it is possible to construct several protographs for a parity check matrix so that a low complexity encoder can be obtained by solving a few parity check equations.

$$B_p = \left\{ \begin{bmatrix} 0111 \\ 1011 \\ 1101 \\ 1111 \end{bmatrix}, \begin{bmatrix} 0111 \\ 1011 \\ 1101 \\ 1110 \end{bmatrix}, \begin{bmatrix} 1101 \\ 1100 \\ 0111 \\ 1011 \end{bmatrix}, \begin{bmatrix} 1001 \\ 1100 \\ 0111 \\ 1011 \end{bmatrix}, \ldots \right\}$$ [Eqn. 24]

For example, applying the prototype mask $B_p(4)$ from Equation 24 to the original array B, where:

$$B = \begin{bmatrix} 111 & 60 & 127 & 19 \\ 0 & 14 & 58 & 62 \\ 0 & 94 & 30 & 59 \\ 0 & 89 & 127 & 101 \end{bmatrix}$$ [Eqn. 25]

yields:

$$\tilde{B} = \begin{bmatrix} 111 & -1 & -1 & 19 \\ 0 & 14 & -1 & -1 \\ -1 & 94 & 30 & 59 \\ 0 & -1 & 127 & 101 \end{bmatrix}. \quad [\text{Eqn. 26}]$$

In equation 26, "−1" denotes a null array, and "0" denotes an identity matrix. Any other positive shift is the extent of shift with respect to the identity matrix.

Additionally, $\tilde{B}$ can be comprised of an array of circulants as shown in Equation 27:

$$\tilde{B} = \begin{bmatrix} \sigma^{a_{11}} & \sigma^{a_{12}} & \sigma^{a_{13}} & \sigma^{a_{14}} \\ \sigma^{a_{21}} & \sigma^{a_{22}} & \sigma^{a_{23}} & \sigma^{a_{24}} \\ \sigma^{a_{31}} & \sigma^{a_{32}} & \sigma^{a_{33}} & \sigma^{a_{34}} \\ \sigma^{a_{41}} & \sigma^{a_{42}} & \sigma^{a_{43}} & \sigma^{a_{44}} \end{bmatrix} \quad [\text{Eqn. 27}]$$

In Equation 27, $\sigma^{a_{ij}}$ is a circulant array obtained by circularly right shifting the identity matrix of size s by $a_{ij}$. In an additional example, an application of $B_p(2)$ to $\tilde{B}$ yields Equation 28:

$$\tilde{B}(B_p(2)) = \begin{bmatrix} \sigma^{a_{11}} & 0 & 0 & \sigma^{a_{14}} \\ \sigma^{a_{21}} & \sigma^{a_{22}} & 0 & 0 \\ 0 & \sigma^{a_{32}} & \sigma^{a_{33}} & \sigma^{a_{34}} \\ \sigma^{a_{41}} & 0 & \sigma^{a_{43}} & \sigma^{a_{44}} \end{bmatrix} \quad [\text{Eqn. 28}]$$

After masking with a prototype, a parity check matrix of the form $\tilde{H}:=[A|\tilde{B}]$ may be obtained. Further, let $\bar{x}=(\bar{u},\bar{p})$ be a valid systematic codeword with user bits $\bar{u}$ and parity bits $\bar{p}$. The codeword is a concatenation of the user bits and the parity bits. Since $H\bar{x}^t=0$, the parity bits can be solved for as using Equations 28 and 29:

$$A\bar{u}^T + \tilde{B}\bar{p}^T = 0. \quad [\text{Eqn. 29a}]$$

$$\bar{p}^T = (\tilde{B}^{-1})A\bar{u}^T. \quad [\text{Eqn. 29b}]$$

With the structure for $\tilde{B}$, the parity bits can be solved on-the-fly by solving the set of equations block-wise. Therefore, the parity bits can be solved for by using the parity matrix as opposed to using a generator matrix. This can be illustrated with the following examples:

Example #1

In the first example, after matrix A has been constructed, it is possible to solve for the equations directly from the correct prototype structure. For example, $\tilde{B}$ can be defined by Equation 30:

$$\tilde{B} = \begin{bmatrix} I & 0 & 0 & \sigma \\ I & I & 0 & 0 \\ 0 & I & I & 0 \\ I & 0 & I & I \end{bmatrix}. \quad [\text{Eqn. 30}]$$

Let the column vector after computing $As^T$ be $[\gamma_1 \gamma_2 \gamma_3 \gamma_4]^T$, with the corresponding parity vector block $\bar{p}=[\bar{p}_1 \bar{p}_2 \bar{p}_3 \bar{p}_4]^T$. Constructing a series of matrix equations yields the following equations:

$$I \cdot p_1 + \sigma \cdot p_4 = \gamma_1 \quad [\text{Eqn. 31}]$$

$$I \cdot p_1 + I \cdot p_2 = \gamma_2 \quad [\text{Eqn. 32}]$$

$$I \cdot p_2 + I \cdot p_3 = \gamma_3 \quad [\text{Eqn. 33}]$$

$$I \cdot p_1 + I \cdot p_3 + I \cdot p_4 = \gamma_4 \quad [\text{Eqn. 34}]$$

Further, $p_1$ through $p_4$ can be solved as follows:

$$p_4 = \gamma_2 + \gamma_3 + \gamma_4 \quad [\text{Eqn. 35}]$$

Use Equation 35 in Equation 31 and solve $p_1$. Then, use $p_1$ in Equation 32 and solve $p_2$. Then, use $p_2$ in Equation 33 and solve $p_3$.

In Equations 31-38, σ represents a shifted identity matrix such as, for example, the 3×3 identity matrix shown in Equation 36:

$$I = \begin{bmatrix} 1 & 0 & 0 \\ 0 & 1 & 0 \\ 0 & 0 & 1 \end{bmatrix} \quad [\text{Eqn. 36}]$$

Then, right shift cyclic yields a proto-type:

$$\sigma = \begin{bmatrix} 0 & 1 & 0 \\ 0 & 0 & 1 \\ 1 & 0 & 0 \end{bmatrix} \quad [\text{Eqn. 37}]$$

Then, right shift cyclic again yields another proto-type:

$$\sigma^2 = \begin{bmatrix} 0 & 0 & 1 \\ 1 & 0 & 0 \\ 0 & 1 & 0 \end{bmatrix} \quad [\text{Eqn. 38}]$$

Example #2

In the second example, a slightly more sophisticated protograph is used, such as illustrated in Equation 39:

$$\tilde{B} = \begin{bmatrix} 0 & I & I & I \\ I & 0 & a & I \\ I & a & I & 0 \\ I & I & 0 & a \end{bmatrix}. \quad [\text{Eqn. 39}]$$

The shift 'a' can be chosen to avoid short cycles. Therefore, the solution vector to $A\bar{u}^T + \tilde{B}\bar{p}^T = 0$ can be expressed by Equations 40-43:

$$p_2 = (a^2+a+I)^{-1}[(a^2+a+I)\gamma_1 + (a+I)\gamma_2 + \gamma_3 + a\gamma_4] \quad [\text{Eqn. 40}]$$

$$p_3 = ap_2 + (a+I)\gamma_1 + \gamma_2 + \gamma_4 \quad [\text{Eqn. 41}]$$

$$p_4 = p_2 + p_3 + \gamma_1 \quad [\text{Eqn. 42}]$$

$$p_1 = p_2 + ap_4 + \gamma_4 \quad [\text{Eqn. 43}]$$

It should be noted that this assumes that there exists an $a: a \neq I \& (a^2+a+I)^{-1}$ that is circulant.

A Family of possible protographs can be constructed for the parity portion of an LDPC matrix for use by the encoder 220 in an OTF encoding process. For example, a code rate can be of the form $$R = \frac{n-4}{n}$$

so that four blocks of parity codes can be solved. It will be understood that the following protographs are not exhaustive but are provided merely as an example. The following protographs shown in Equations 44-48 provide a list of tentative candidates for use in solving the equations.

$$\tilde{B} = \begin{bmatrix} I & 0 & 0 & 0 \\ I & \sigma & 0 & 0 \\ I & \sigma^2 & \sigma^4 & 0 \\ I & \sigma^3 & \sigma^6 & \sigma^9 \end{bmatrix} \quad [\text{Eqn. 44}]$$

$$\tilde{B} = \begin{bmatrix} I & I & 0 & 0 \\ 0 & I & I & 0 \\ \sigma^5 & 0 & I & I \\ I & 0 & 0 & I \end{bmatrix} \quad [\text{Eqn. 45}]$$

$$\tilde{B} = \begin{bmatrix} I & 0 & 0 & \sigma \\ I & I & 0 & 0 \\ 0 & I & I & 0 \\ I & 0 & I & I \end{bmatrix} \quad [\text{Eqn. 46}]$$

$$\tilde{B} = \begin{bmatrix} 0 & I & I & I \\ I & 0 & \sigma^5 & I \\ I & \sigma^5 & I & 0 \\ I & I & 0 & \sigma^5 \end{bmatrix} \quad [\text{Eqn. 47}]$$

$$\tilde{B} = \begin{bmatrix} \sigma^5 & I & I & I \\ I & 0 & \sigma^5 & I \\ I & \sigma^5 & I & 0 \\ I & I & 0 & \sigma^5 \end{bmatrix} \quad [\text{Eqn. 48}]$$

Each of the parity check structures has different column weight degrees. The simplest structure is shown in Equation 44, which is of a Type-I architecture. The structure shown in Equation 44 is very simple but may not be desirable due to column weight one on one of its columns. The structure shown in Equation 45 has column weights (3, 2, 2, 2), while structure shown in Equation 48 has column weights (4, 3, 3, 3). In this example, there could be sixteen (16) different protographs that vary from column weights (3, 2, 2, 2) to (4, 3, 3, 3).

Using the ideas presented above with respect to Examples 1 and 2, the equations can be solved through simple additions over GF(2) for each prototype. The rate parameter can influence a certain protograph. Depending upon $$R = \frac{n-j}{n},$$

it is straightforward to build a family of parity protograph matrices in blocks of j×j to obtain the desired performance.

The embodiments disclosed herein can be applicable for efficient encoding of Q-ary/finite field-based LDPC codes. For example, in this representation, every '1' occurring in the circulant can be replaced by an element from a finite field.

As an example, the parity protograph matrices over a finite field (for example, non-binary structures for doing efficient encoding) can be constructed as follows. Elements from $GF(4) = \{1, \alpha, \alpha^2, \alpha^3\}$ are chosen for populating the ones within the circulant. The primitive polynomial for GF(4) is $f(x) = 1 + x + x^2$. Further, a circulant order '4' is chosen. Over GF(4), let $\sigma_{2^2}$, as defined by Equation 49, be the mother circulant matrix for obtaining the shifts.

$$\sigma_{2^2} = \begin{bmatrix} 0 & 2 & 0 & 0 \\ 0 & 0 & 3 & 0 \\ 0 & 0 & 0 & 1 \\ 2 & 0 & 0 & 0 \end{bmatrix} \quad [\text{Eqn. 49}]$$

If protograph structure shown in Equation 48 is chosen, the following can be computed:

$$I_{2^2} = \begin{bmatrix} 2 & 0 & 0 & 0 \\ 0 & 3 & 0 & 0 \\ 0 & 0 & 1 & 0 \\ 0 & 0 & 0 & 2 \end{bmatrix}. \quad [\text{Eqn. 50a}]$$

$$\sigma_{2^2}^2 = \begin{bmatrix} 0 & 0 & 2 & 0 \\ 0 & 0 & 0 & 3 \\ 1 & 0 & 0 & 0 \\ 0 & 2 & 0 & 0 \end{bmatrix}. \quad [\text{Eqn. 50b}]$$

Equation 50 illustrates the difference in the identity $I_{2^2}$ from the conventional identity matrix over GF(2). The encoder 220 can be configured to utilize the principles disclosed hereinabove for an irregular type of matrix at the information part and a protograph structure for the parity part, thus allowing extensions beyond to other matrices.

Accordingly, the encoder 220 can be configured to perform an OTF encoding operation, without using a generator matrix (e.g., without using a stored generator matrix), using simple shifts and additions for easier protographs. For example, even for a slightly complicated protograph, the encoder 220 uses one circulant order size matrix to store the inversion result, and the rest of the encoder 220 circuitry can be implemented using register shifters and adders (e.g., additions).

Figure 4A:
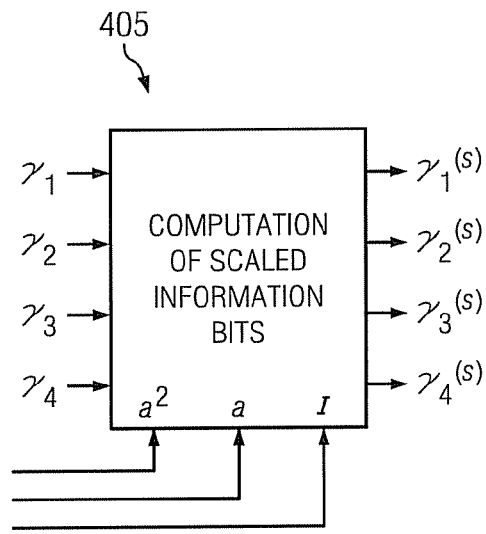
FIGS. 4A through 4C illustrate encoder processor blocks according to embodiments of the present disclosure.
Figure 4B:
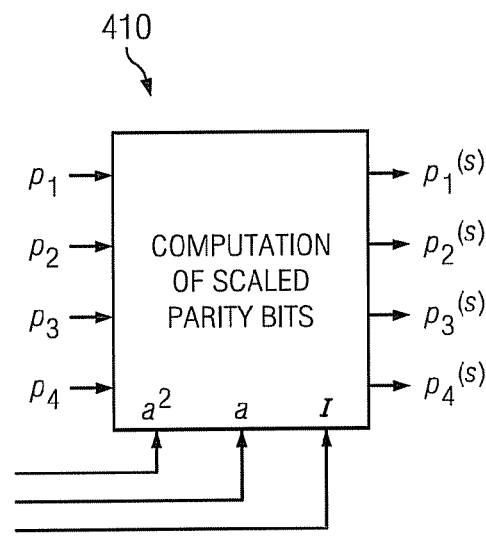
Figure 4C:
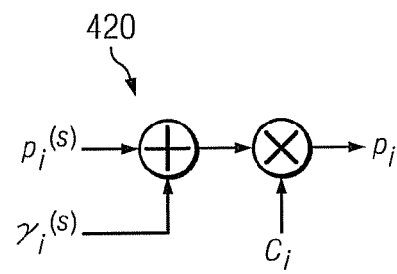

FIGS. 4A through 4C illustrate encoder processor blocks according to embodiments of the present disclosure. The embodiment of the processor blocks shown in FIGS. 4A through 4C are for illustration only. Other embodiments could be used without departing from the scope of this disclosure.

Each of the processor blocks 405, 410, 415 shown in FIGS. 4A through 4C can be included in separate processors in processor array 320 or one or more of the processor blocks 405, 410, 415 can be included in a single processor. The processor blocks 405, 410, 415 can implement Equations 51-54.

$$p_2 = (a^2 + a + I)^{-1}[(a^2 + a + I)\gamma_1 + (a + I)\gamma_2 + \gamma_3 + a\gamma_4] \quad [\text{Eqn. 51}]$$

$$p_3 = ap_2 + (a + I)\gamma_1 + \gamma_2 + \gamma_4 \quad [\text{Eqn. 52}]$$

$$p_4 = p_2 + p_3 + \gamma_1 \quad [\text{Eqn. 53}]$$

$$p_1 = p_2 + ap_4 + \gamma_4 \quad [\text{Eqn. 54}]$$

The processor blocks 405, 410, 415 include a number of shifters and adders (not specifically illustrated). Since the element $a^2$ is already a group element, the inputs can be easily computed using shifters and adders. Also, since the inverse matrix is circulant for most cases, the logic of shifting can be exploited for doing this. Note that the base shift for $(a^2+a+I)^{-1}$ (for example, identifying the location of ones to see for repeated patterns) can be compactly represented, which saves space in memory such as a Read Only Memory (ROM).

Each of the processor blocks 405, 410, 415 can implement a different function. For example, processor block 405 can perform computation of scaled information bits such as, for example, by solving Equation 55:

$$\gamma_2^{(s)} = (a^2+a+I)\gamma_1 + (a+I)\gamma_2 + \gamma_3 + a\gamma_4 \qquad [\text{Eqn. 55}]$$

For example, processor block 405 can perform computation of scaled information bits such as, for example, by solving Equation 55:

$$\gamma_2^{(s)} = (a^2+a+I)\gamma_1 + (a+I)\gamma_2\gamma_3 a\gamma_4 \qquad [\text{Eqn. 55}]$$

Additionally, processor block 410 can perform computation of scaled parity bits such as, for example, by solving Equation 56:

$$p_1^{(s)} = p_2 + ap_4 \qquad [\text{Eqn. 56}]$$

For example, processor block 415 can perform computation of an $i^{th}$ parity block such as, for example, by solving Equations 57a and 57b:

$$p_2 = p_2^{(s)} + \gamma_2^{(s)} \qquad [\text{Eqn. 57a}]$$

$$C_2 = (a^2+a+I)^{-1} \qquad [\text{Eqn. 57b}]$$

The processor blocks 405, 410 could represent any suitable hardware, software, firmware, or combination thereof performing the desired computations. Also, the components in processor block 415 could each represent any suitable hardware, software, firmware, or combination thereof performing the desired computation.

The encoder 220 when configured for OTF encoding, can be used in a wide range of systems or devices. For example, the encoder 220 can be used in communication channels that employ high rate codes. Examples may include storage channels employing high rate codes, including those in digital storage applications such as magnetic recording channels, optical recording channels (like CDs or DVDs), and holographic memory systems. Other examples include wireless channels in wireless systems and multimedia systems that may require some sort of channel coding.

Figure 5:
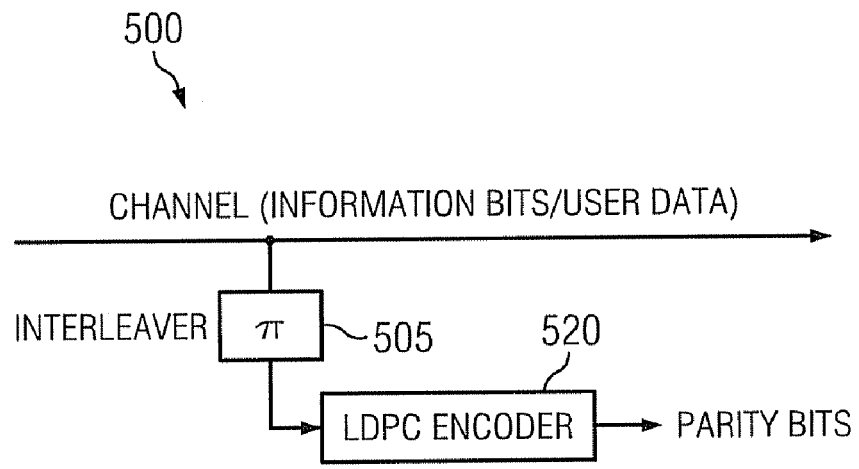
FIG. 5 illustrates an example LDPC encoding system according to embodiments of the present disclosure.

FIG. 5 illustrates an example LDPC encoding system according to embodiments of the present disclosure. The embodiment of the LDPC encoding system 500 shown in FIG. 5 is for illustration only. Other embodiments could be used without departing from the scope of this disclosure.

The LDPC encoding system 500 includes an interleaver 505 and an LDPC encoder 520. LDPC encoder 520 can include the same functionality as the encoder 220 illustrated in FIG. 2.

The LDPC encoder 520 is configured to systematically encode user data into an LDPC code word. The block diagram of the LDPC encoding system 500 may represent the write path for many storage systems, where data is written onto a storage medium (such as for example, memory 320). The user data is processed through interleaver 505. Interleaver 505 can be any sort of computational block or blocks configured to perform interleaving as is known in the art. The interleaved data is fed to the LDPC encoder 520 to generate the parity bits. The LDPC encoder 520 is configured to generate the parity bits without creating or storing a generator matrix. For example, the LDPC encoder 520 can be configured operate as described above to obtain parity bits on-the-fly. The LDPC encoder 520 can perform on-the-fly encoding when configured as either binary or finite field based LDPC encoders.

Additionally, the LDPC encoder 520 can be configured to use any current or future-developed finite field code The interleaver 505 and the LDPC encoder 520 could each represent any suitable hardware, software, firmware, or combination thereof for performing the desired computations or functions. In particular embodiments, the interleaver 505 and the LDPC encoder 520 could be implemented in a silicon-on-a-ship (SOC) product or other semiconductor chip.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

Figure 6:
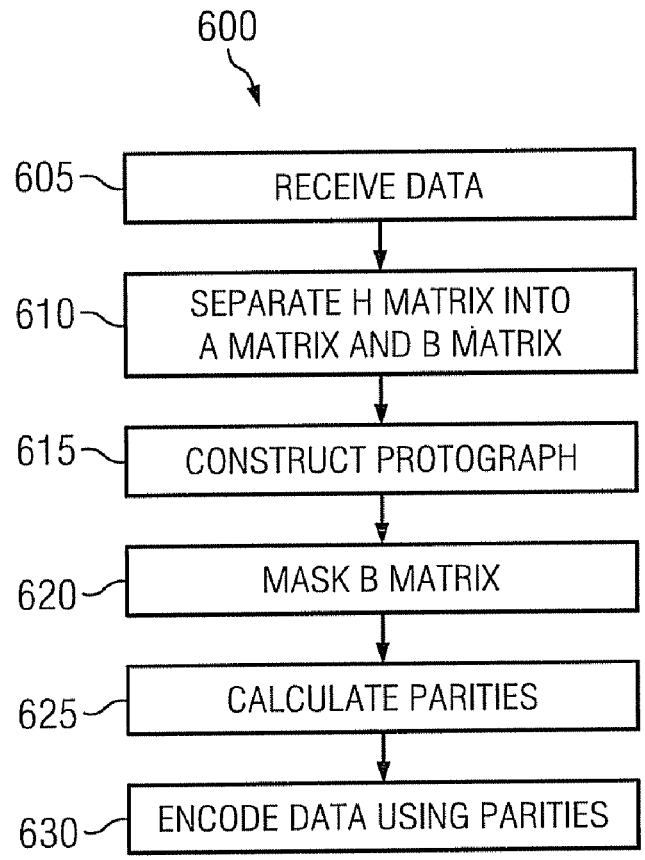
FIG. 6 illustrates a process for generating parity bits on-the-fly according to embodiments of the present disclosure.

FIG. 6 illustrates a process for generating parity bits on-the-fly according to embodiments of the present disclosure. The embodiment of the process 600 shown in FIG. 6 is for illustration only. Other embodiments could be used without departing from the scope of this disclosure. It will be understood that one or more blocks could be omitted, modified, or rearranged and additional blocks could be added in FIG. 6.

In block 605, a number of data bits are received for encoding. The data bits may have been received from another system or from a data storage medium, such as, for example, a magnetic storage medium, optical storage medium or holographic storage medium.

In block 610, the LDPC H matrix is separated into two portions, A and B. The H matrix is decomposed as follows: $H := [A|B]$. In some embodiments, the H matrix is pre-separated and the encoder is configured to store one or more of the H matrix, A matrix and B matrix. In some embodiments, the encoder retrieves the H matrix from memory and separates the H matrix into the sub-matrices.

In block 615, a family of protographs is constructed. In some embodiments, a family of prototypes for use in creating the protographs is pre-constructed and pre-loaded into the memory of the encoder. In some embodiments, the family of prototypes for use in creating the protographs is constructed by the encoder. The family of protographs can be of the form that corresponds to an upper triangle based parity check matrix as shown in Equation 58:

$$B = \begin{bmatrix} I & 0 & 0 & 0 \\ I & \sigma & 0 & 0 \\ I & \sigma^2 & \sigma^4 & 0 \\ I & \sigma^3 & \sigma^6 & \sigma^9 \end{bmatrix} \qquad [\text{Eqn. 58}]$$

In additional and alternative embodiments, the family of protographs can be of the form as shown in Equations 59 and 60:

$$P_1 = \begin{bmatrix} I & 0 & 0 & \sigma \\ I & I & 0 & 0 \\ 0 & I & I & 0 \\ I & 0 & I & I \end{bmatrix} \qquad [\text{Eqn. 59}]$$

-continued $$P_2 = \begin{bmatrix} 0 & I & I & I \\ I & 0 & \sigma^5 & I \\ I & \sigma^5 & I & 0 \\ I & I & 0 & \sigma^5 \end{bmatrix}$$ [Eqn. 60]

In block 620, the B matrix is masked using at least one of the protographs from the family of prototypes to construct one or more protographs for block 615. One or more of the protographs are selected and applied to the B matrix using matrix multiplication. The encoder applies the prototype mask to produce the protograph $\tilde{B}$ matrix.

In block 625, the encoder calculates the parities. The parities are calculated using the protograph $\tilde{B}$ matrix and the relation defined in Equations 29a and 29b, reproduced here:

$$A\overline{u}^T + \tilde{B}\overline{p}^T = 0.$$ [Eqn. 29a]

$$\overline{p}^T = (\tilde{B}^{-1})A\overline{u}^T.$$ [Eqn. 29b]

In block 630, the encoder encodes the data using the parities. The encoding process transforms the data into codewords that can be transmitted along a communication channel.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A device configured to encode data using a Low Density Parity Check (LDPC) code, the device comprising:
   an input configured to receive data;
   an output configured to output a plurality of codewords; and
   a processor coupled between the input and the output, the processor configured to encode the received data, to create a plurality of parity bits on-the-fly while processing the received data using a parity matrix structured to permit block-wise, on-the-fly solution of parity equations, and to produce the plurality of codewords using the plurality of parity bits.

2. The device as set forth in claim 1, wherein the processor is configured to create the plurality of parity bits on-the-fly without using a generator matrix.

3. The device as set forth in claim 1, further comprising an interleaver coupled between the input and the processor.

4. The device as set forth in claim 1, wherein the processor is configured to create the plurality of parity bits on-the-fly using at least one of a plurality of parity matrices derived from an LDPC H matrix.

5. The device as set forth in claim 4, wherein at least a portion of the LDPC H matrix is masked with at least one prototype matrix to produce the plurality of protograph matrices.

6. The device as set forth in claim 1, wherein the processor is configured to create the plurality of parity bits on-the-fly by solving at least one of the following equations:

$$p_2 = (a^2 + a + I)^{-1}[(a^2 + a + I)\gamma_1 + (a + I)\gamma_2 + \gamma_3 + a\gamma_4];$$

$$p_3 = ap_2 + (a + I)\gamma_1 + \gamma_2 + \gamma_4;$$

$$p_4 = p_2 + p_3 + \gamma_1; \text{ and}$$

$$p_1 = p_2 + ap_4 + \gamma_4,$$

wherein "p" denotes a parity bit, "a" denotes a shift value and "γ" is a column vector value for a portion of an LDPC matrix.

7. The device as set forth in claim 1, wherein the parity matrix is derived based upon encoding of Q-ary/finite field-based LDPC codes.

8. A system configured to transmit data, the system comprising:
   at least one encoder, the at least one encoder comprising:
      a processor array configured to:
         generate a plurality of parity bits on-the-fly by block-wise solution of parity equations based on a parity matrix derived from at least a portion of the Low Density Parity Check (LDPC) H Matrix, and
         perform an LDPC coding operation using the plurality of parity bits,
   wherein the processor array is configured to generate the plurality of parity bits while performing the LDPC coding operation.

9. The system as set forth in claim 8, the encoder further comprising a plurality of instructions wherein a portion of the plurality of instructions is stored in an instruction controller, and wherein the plurality of instructions is configured to cause the processor array to generate the plurality of parity bits and perform the LDPC operation.

10. The system as set forth in claim 8, wherein the processor array is configured to generate the plurality of parity bits without using a generator matrix.

11. The system as set forth in claim 8, wherein the parity matrix is generated using one of a plurality of protograph matrices formed by applying at least one circulant function on the portion of the LDPC H matrix.

12. The system as set forth in claim 11, wherein the portion of the LDPC H matrix is masked with at least one prototype matrix to construct at least one of the plurality of protograph matrices.

13. The system as set forth in claim 8, wherein the processor array is configured to generate the plurality of parity bits by solving at least one of the following equations:

$$p_2 = (a^2 + a + I)^{-1}[(a^2 + a + I)\gamma_1 + (a + I)\gamma_2 + \gamma_3 + a\gamma_4];$$

$$p_3 = ap_2 + (a + I)\gamma_1 + \gamma_2 + \gamma_4;$$

$$p_4 = p_2 + p_3 + \gamma_1; \text{ and}$$

$$p_1 = p_2 + ap_4 + \gamma_4,$$

wherein "p" denotes a parity bit, "a" denotes a shift value and "γ" is a column vector value for a portion of an LDPC matrix.

14. The system as set forth in claim 8, wherein the parity matrix is derived based upon encoding of Q-ary/finite field-based LDPC codes.

15. The system as set forth in claim 8, wherein the parity matrix is derived based upon encoding of Q-ary/finite field-based LDPC codes.

16. A method designed to code data, the method comprising:
   generating, by at least one encoder unit, a plurality of parity bits on-the-fly by block-wise solution of parity equations based on a parity matrix derived from at least a portion of the Low Density Parity Check (LDPC) H Matrix; and performing an LDPC coding operation using the plurality of parity bits and generating the plurality of parity bits while performing the LDPC coding operation.

17. The method as set forth in claim 16, wherein generating the plurality of parity bits is performed without using a generator matrix.

18. The method as set forth in claim 16, further comprising generating a parity matrix using one of a plurality of protograph matrices formed by applying at least one circulant function on the portion of the LDPC H matrix.

19. The method as set forth in claim 16, wherein generating the plurality of parity bits comprises masking the portion of the LDPC H matrix with at least one prototype matrix.

20. The method as set forth in claim 16, wherein generating the plurality of parity bits comprises solving at least one of the following equations:

$$p_2 = (a^2 + a + I)^{-1}[(a^2 + a + I)\gamma_1 + (a + I)y_2 + \gamma_3 + a\gamma_4];$$

$$p_3 = ap_2 + (a + I)\gamma_1 + \gamma_2 + \gamma_4;$$

$$p_4 = p_2 + p_3 + \gamma_1; \text{ and}$$

$$p_1 = p_2 + ap_4 + \gamma_4,$$

wherein "p" denotes a parity, "a" denotes a shift value and "γ" is a column vector value for a portion of an LDPC matrix.

\* \* \* \* \*